(12) United States Patent
Zhou

(10) Patent No.: US 12,259,492 B2
(45) Date of Patent: Mar. 25, 2025

(54) ZERO-PHASE CALIBRATION METHOD, COMPUTER DEVICE AND STORAGE MEDIUM

(71) Applicant: Tunkia Co., Ltd., Hunan (CN)

(72) Inventor: Xinhua Zhou, Hunan (CN)

(73) Assignee: Tunkia Co., Ltd., Hunan (CN)

( * ) Notice: Subject to any disclaimer, the term of this patent is extended or adjusted under 35 U.S.C. 154(b) by 0 days.

(21) Appl. No.: 18/721,717

(22) PCT Filed: Nov. 10, 2022

(86) PCT No.: PCT/CN2022/131224
§ 371 (c)(1),
(2) Date: Jun. 19, 2024

(87) PCT Pub. No.: WO2024/098342
PCT Pub. Date: May 16, 2024

(65) Prior Publication Data
US 2025/0004102 A1 Jan. 2, 2025

(51) Int. Cl.
*G01S 7/40* (2006.01)
*G01R 35/00* (2006.01)

(52) U.S. Cl.
CPC .......... *G01S 7/4008* (2013.01); *G01R 35/005* (2013.01)

(58) Field of Classification Search
CPC .............. G01R 31/2884; G01R 31/282; G01R 31/2853; G01R 31/2836; G01R 35/005; H03B 5/32; G01S 7/40; G01S 7/4008
See application file for complete search history.

(56) References Cited

U.S. PATENT DOCUMENTS 4,908,627 A * 3/1990 Santos .................. G01S 7/4008
342/42
4,937,535 A * 6/1990 Underwood ......... G01R 35/005
330/2

(Continued)

FOREIGN PATENT DOCUMENTS

| CN | 104535954 A | 4/2015 |
|----|-------------|--------|
| CN | 105607022 A | 5/2016 |

(Continued)

OTHER PUBLICATIONS

Xinhua Zhou; Alteration of circulating unconventional T cells in cerebral ischemia: an observational study; Scientific Reports.

(Continued)

*Primary Examiner* — Peter M Bythrow
(74) *Attorney, Agent, or Firm* — IPRO, PLLC

(57) ABSTRACT

A zero-phase calibration method includes: selecting a group of range combinations with the same ranges and a group of adjacent range combinations consisting of the range and a smaller range adjacent to the range between different channels of a wide-range meter, measuring phase calibration parameters between channel signals of the group of range combinations with the same ranges and phase calibration parameters between channel signals of the group of adjacent range combinations, storing the measured phase calibration parameters in a memory, invoking the measured phase calibration parameters stored in the memory to calculate phase calibration parameters between channel signals of each of the remaining range combinations of the wide-range meter level by level, and storing the calculated phase calibration parameters in the memory, invoking corresponding phase calibration parameters stored in the memory to calibrate zero-phase points between different channels of signals of the meter while calibrating the wide-range meter.

14 Claims, 3 Drawing Sheets

(56) References Cited

U.S. PATENT DOCUMENTS

| | | | | |
|---|---|---|---|---|
| 5,012,181 | A * | 4/1991 | Eccleston | G01R 35/005 |
| | | | | 341/120 |
| 5,124,708 | A * | 6/1992 | Mackes | G01S 7/4008 |
| | | | | 342/194 |
| 5,125,008 | A | 6/1992 | Trawick et al. | |
| 6,018,246 | A * | 1/2000 | Dunsmore | G01R 27/28 |
| | | | | 324/76.27 |
| 6,606,583 | B1 * | 8/2003 | Sternberg | G01R 35/005 |
| | | | | 702/191 |
| 6,759,837 | B2 * | 7/2004 | Gandhi | G01R 21/133 |
| | | | | 324/74 |
| 6,911,813 | B2 * | 6/2005 | Gandhi | G01R 21/133 |
| | | | | 324/76.55 |
| 2003/0042886 | A1 * | 3/2003 | Gandhi | G01R 21/133 |
| | | | | 324/142 |
| 2009/0109085 | A1 * | 4/2009 | Needham | G01S 13/762 |
| | | | | 342/174 |
| 2009/0237295 | A1 | 9/2009 | Jaklitsch et al. | |
| 2010/0321233 | A1 | 12/2010 | Ben-Zur et al. | |
| 2012/0191395 | A1 | 7/2012 | Bandsmer | |
| 2019/0204370 | A1 * | 7/2019 | Virtala | G01R 19/0007 |
| 2020/0132810 | A1 * | 4/2020 | Subburaj | G01S 7/4021 |
| 2020/0174098 | A1 * | 6/2020 | Lang | G01S 7/4008 |
| 2023/0261390 | A1 * | 8/2023 | Jagjit | H04B 17/221 |
| | | | | 343/893 |
| 2023/0350014 | A1 * | 11/2023 | Bar-Shalom | H01Q 3/267 |
| 2023/0384418 | A1 * | 11/2023 | Jeannin | G01S 13/584 |

FOREIGN PATENT DOCUMENTS

| | | |
|---|---|---|
| CN | 110031811 A | 7/2019 |
| CN | 110146864 A | 8/2019 |
| CN | 110375788 A | 10/2019 |
| CN | 111044963 A | 4/2020 |
| CN | 111289950 A | 6/2020 |
| CN | 112383365 A | 2/2021 |
| CN | 113655456 A | 11/2021 |
| CN | 113820642 A | 12/2021 |
| CN | 114217278 A | 3/2022 |
| CN | 114710383 A | 7/2022 |
| WO | 2003084104 A | 10/2003 |
| WO | 2020000204 A | 1/2020 |

OTHER PUBLICATIONS

Ruifeng Duan; Hybrid Beamformer Design for High Dynamic Range Ambient Backscatter Receivers;2019 IEEE International Conference on Communications Workshops (ICC Workshops), Shanghai, China, 2019.

Chen Xin1 Zhou Zheling; Deng Jianqing; Design of calibration device for zinc oxide arrester tester based on FPGA ; Shantou Science & Technology |Issue 2, 2018 |p. 51-55| Total 5 pages.

Ji Yindong; Sun Xinya; A digital calibration method for fundamental components of phasors;Power System Automation |No. 8, 2007 |67-70|4 pages.

Xiao Tao; Zhou Xinhua; Dong Yiwei; Calibration of the test equipment for DC power ripple impact; "Automation Instrumentation" |Issue 5, 2019 |83-86|4 pages.

Yao Zhiqing; Wang Pengfei; Chen Guanghua; Zhang Yang; Mu Xiaoliang; Pang Tao; He Chun; Development and performance analysis of a measurement error test and calibration device for a merging unit tester in a power system; Power System Protection and Control |Issue 2 of 2022 | 119-126| Total 8 pages.

* cited by examiner

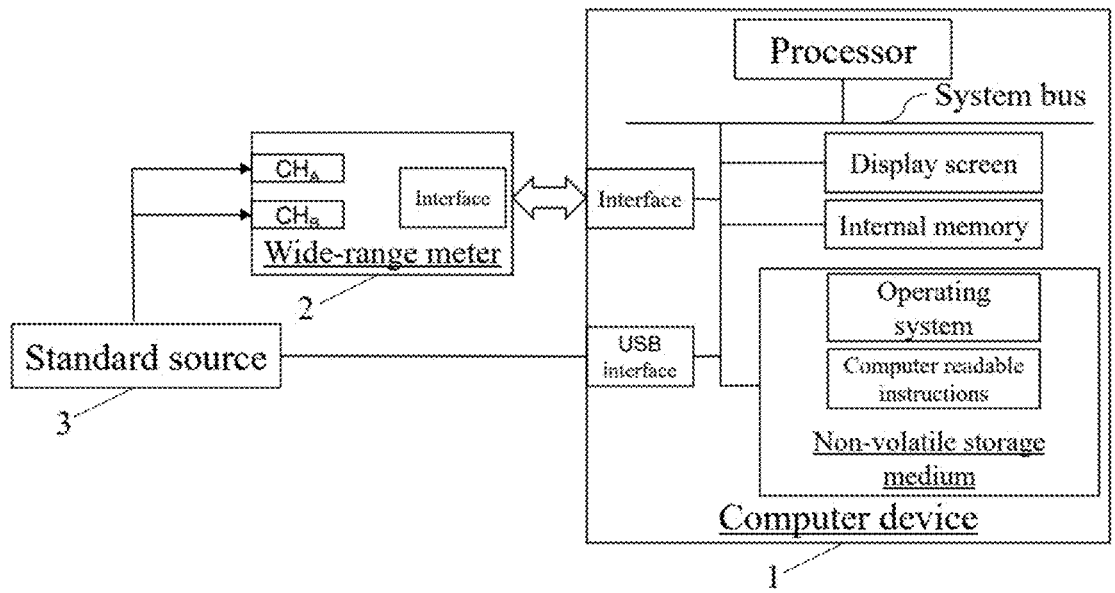

FIG. 3

Selecting a group of range combinations with the same ranges and a group of adjacent range combinations consisting of the range and a smaller range adjacent to the range between different channel A and channel B of a wide-range meter, measuring phase calibration parameters between channel signals of the group of range combination with the same ranges and phase calibration parameters between channel signals of the group of adjacent range combinations — S1

Accomplishing measurements of the phase calibration parameters of all of the group of range combinations with the same ranges and the group of adjacent range combinations, and storing the measured phase calibration parameters in a memory — S2

Invoking the measured phase calibration parameters stored in the memory to calculate phase calibration parameters between channel signals of each of the remaining range combinations of the wide-range meter level by level — S3

Storing the calculated phase calibration parameters in the memory — S4

Invoking corresponding phase calibration parameters stored in the memory to calibrate zero-phase points between different channels of signals of the meter while calibrating the wide-range meter — S5

ZERO-PHASE CALIBRATION METHOD, COMPUTER DEVICE AND STORAGE MEDIUM

TECHNICAL FIELD

The present application relates to the field of phase calibration. Specifically, the present application relates to a zero-phase calibration method, computer device and storage medium.

BACKGROUND

Wide-range meters such as vector voltage analyzers combined with voltage or current range extenders, can realize multi-channel voltage or current ratio measurement, phase difference measurement and realize power measurement function with combined voltage and current channels, etc. Such types of meters usually need to be calibrated on effective values of channel voltage/current and inter-channel phase difference error before use, so as to ensure measurement accuracy thereof. Presently, calibration of channel phase difference of vector voltage analyzers and other multi-channel measuring meters, such as phase meters, generally uses a high precision signal source with high stability and low noise, which is adjustable on amplitude and frequency, utilizing the means of a voltage divider or shunt to calibrate zero-phase points directly. Due to the numerous channels and measurement ranges of a wide-range meter, there are a plurality of range combinations that need to be calibrated. Current calibration methods mostly utilize the way of manual calibration, which is inefficient, with low-precision and long calibration duration. Some automatic calibration methods require to scan all combinations of ranges, resulting in very time-consuming calibration process.

In addition, when a wide-range meter measures with a combination of a large-range and a small-range having a wide span between different channels, due to the need to introduce a voltage divider or shunt to obtain a small amplitude signal and input it into the channel with the small range for initial calibration, such calibration methods cannot achieve high-precision phase quantitative dissemination as the limitation of phase-frequency characteristics of the voltage divider or shunt.

Therefore, existing phase calibration methods cannot fulfill the requirement of accuracy and efficiency of phase-frequency calibration of wide-range meters.

BRIEF DESCRIPTION OF THE INVENTION

According to various embodiments disclosed in the present application, it is provided a zero-phase calibration method, computer device, and storage medium.

A zero-phase calibration method is used to calibrate zero-phase points between different channels of signals of a wide-range meter. The method includes:

Step S1, selecting a group of range combinations with the same ranges and a group of adjacent range combinations consisting of the range and a smaller range adjacent to the range between different channel A and channel B of a wide-range meter, measuring phase calibration parameters between channel signals of the group of range combinations with the same ranges and phase calibration parameters between channel signals of the group of adjacent range combinations;

Step S2, accomplishing measurements of phase calibration parameters of all of the group of range combinations with the same ranges and the group of adjacent range combinations, and storing the measured phase calibration parameters in a memory;

Step S3, invoking the measured phase calibration parameters stored in the memory to calculate phase calibration parameters between channel signals of each of the remaining range combinations of the wide-range meter level by level;

Step S4, storing the phase calibration parameters calculated in step S3 in the memory; and Step S5, invoking corresponding phase calibration parameters stored in the memory to calibrate zero-phase points between different channels of signals of the meter while calibrating the wide-range meter.

It is provided a computer device comprising a memory and one or more processors. Computer-readable instructions are stored in the memory. When the computer-readable instructions are executed by one or more processors, the steps of the zero-phase calibration method provided in any embodiment of the present application are implemented.

It is provided one or more non-volatile computer-readable storage mediums storing computer-readable instructions. When the computer-readable instructions are executed by one or more processors, one or more processors implement the steps of the zero-phase calibration method provided in any embodiment of the present application. The details of one or more embodiments of the present application are set forth in the accompanying drawings and the description below. Other features and advantages of the present application will be apparent from the description, drawings and claims.

DESCRIPTION OF THE DRAWINGS

In order to illustrate the technical solutions in the embodiments of the present application more clearly, the drawings to be utilized in the embodiments will be briefly introduced below. Obviously, the drawings in the following description are only some embodiments of the present application. Those of ordinary skills in the art can also achieve other drawings based on these drawings without creative efforts.

FIG. 3 is a schematic drawing of a calibration environment of the zero-phase calibration method according to one or more embodiments.

FIG. 4 is a flow chart of the zero-phase calibration method according to one or more embodiments.

FIG. 5 is a matrix diagram of phase calibration parameters between channel signals of each range combination when calibrating with the zero-phase calibration method according to one or more embodiments.

DETAILED DESCRIPTION OF THE INVENTION

In order to make the technical solutions and advantages of the present application more apparent, the present application will be further described in detail below with reference to the drawings and embodiments. It should be understood that the specific embodiments described herein are only used to illustrate the present application without limiting it.

Figure 1:
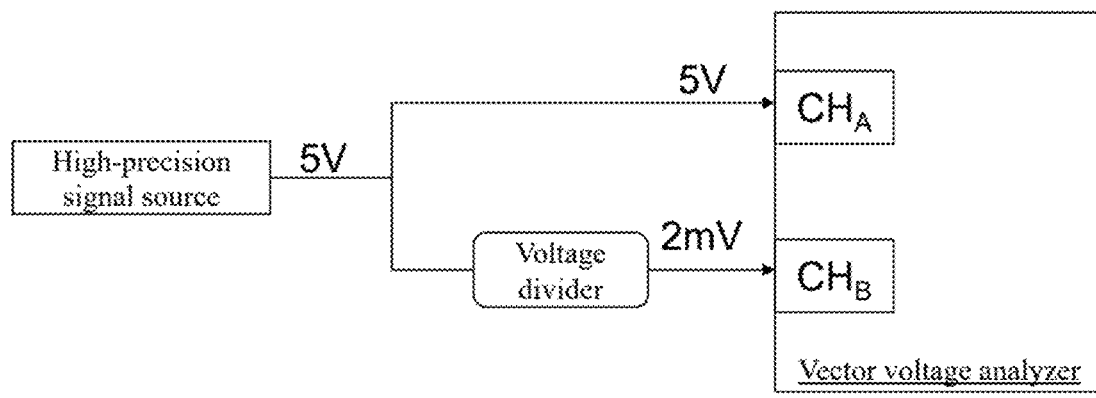
FIG. 1 is a schematic drawing of connection of zero-phase calibration between a large-range channel and a small-range channel of a vector voltage analyzer by means of a voltage divider according to one or more embodiments in the prior art.

Referring to FIG. 1, which is a schematic drawing of connection of zero-phase calibration between a channel with a large range and a channel with a small range of a vector voltage analyzer by means of a voltage divider in the prior art. As shown in FIG. 1, when measuring with the vector voltage analyzer, there is a combination of a large range of 5V and a small range of 2 mV between different channels $CH_A$ and $CH_B$. The initial calibration utilizes a high-precision signal source to output two channels of signals with the full-scale amplitude of the large range of 5V, with one channel of signal being directly input into the channel $CH_A$ with the large range of 5V of the vector voltage analyzer to be calibrated, while the other channel of signal being introduced into a voltage divider to obtain a signal with a small-amplitude of the small range of 2 mV, so as to be input into the channel $CH_B$ with the small range of 2 mV of the vector voltage analyzer to be calibrated. Nevertheless, such a calibration method cannot achieve high-precision phase quantitative dissemination as the limitation of phase-frequency characteristics of the voltage divider. In addition, it is necessary to use a voltage divider to obtain a signal with the corresponding small amplitude and input it into the channel with a small range for initial calibration for other range combinations with a large span between channels of the vector voltage analyzer, which makes the calibration process very time-consuming.

The technical solutions in the embodiments of the present application will be clearly and completely described below with reference to the accompanying drawings of the embodiments thereof, so that the purpose and advantages of the present application will be more clearly understood. Obviously, the embodiments as described are part of the embodiments of the present application, but not exhaustive embodiments.

Figure 2:
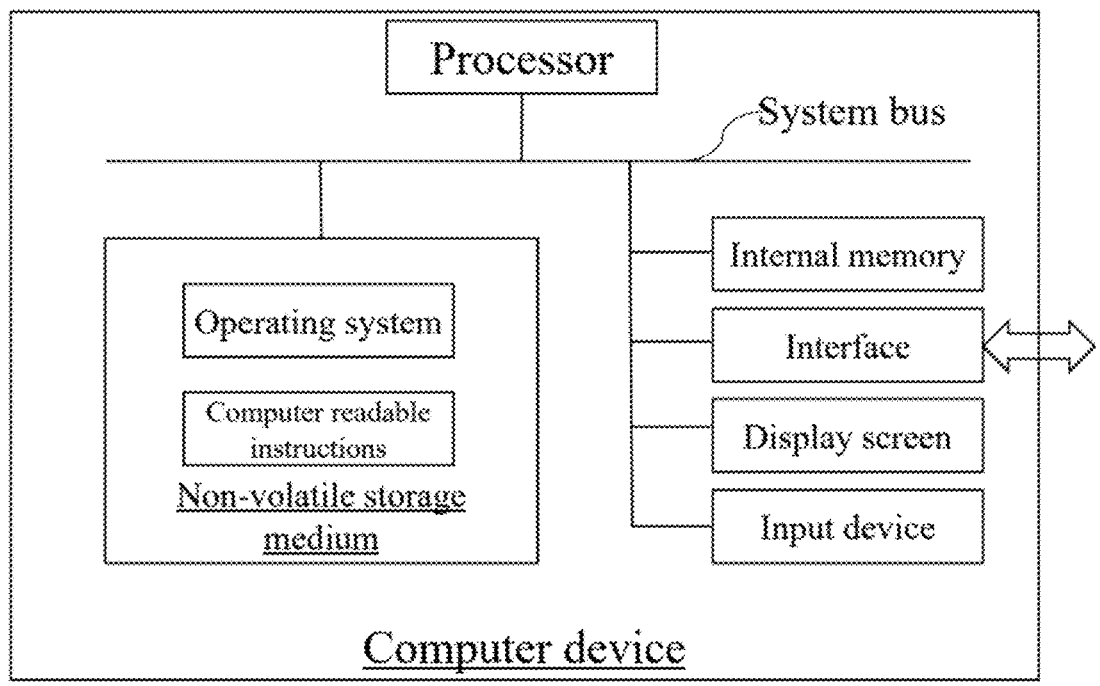
FIG. 2 is a schematic drawing of an application environment of a zero-phase calibration method according to one or more embodiments.

Referring to FIG. 2, which is a schematic drawing of the application environment of the zero-phase calibration method provided by an embodiment of the present application. In the application environment as shown in FIG. 2, the computer device can be a server, and its internal structure diagram can be as shown in FIG. 2. The computer device comprises a processor, a memory, an interface and a database connected through a system bus. Wherein, the processor of the computer device is used to provide computing and control capabilities. The memory of the computer device includes a non-volatile storage medium and an internal memory. The non-volatile storage medium stores an operating system, computer-readable instructions and the database. The internal memory provides an environment for execution of the computer-readable instructions and the operating system in the non-volatile storage medium. The database of the computer device is used for storing data of the zero-phase calibration method. The interface of the computer device is used for communication with external terminals. The computer readable instructions, when executed by the processor, can implement the zero-phase calibration method.

Referring to FIG. 3, which is a schematic drawing of the calibration environment of the zero-phase calibration method provided by an embodiment of the present application. In the calibration environment as shown in FIG. 3, automatic calibration of zero-phase points between different channels of the wide-range meter 2 is realized through the computer device 1. The computer device 1 is similar to the computer device as shown in FIG. 2 and will not be described repetitively herein.

In the embodiment as shown in FIG. 3, the zero-phase point between two different channels $CH_A$ and $CH_B$ of the wide-range meter 2 is automatically calibrated by means of the computer device 1 executing the zero-phase calibration method as claimed in the present application which controls a standard source 3. The wide-range meter 2 is a meter with extensive ranges and a plurality of signal channels, including but not limited to a vector voltage analyzer, a phase meter, a three-phase standard energy meter, etc. Such type of meter comprises more than two signal channels. Each channel has a plurality of measurement ranges, and the range amplitudes of corresponding measurement range of each channel are equal. For example, the range amplitude of the i-th range of the channel $CH_A$ and the i-th range of the channel $CH_B$ are equal. The standard source 3 is a high-precision signal source with high stability, low noise as well as with adjustable amplitude and frequency, such as a multifunctional calibrator with the model TD1880 developed by the applicant of the present application.

Concept of the Invention

The basic principle of the present application is that, for two different channels $CH_A$ and $CH_B$ of a wide-range meter 2, selecting the i1-th range and the i2-th range of the channel $CH_A$, and the j1-th range and the j2-th range of the channel $CH_B$, the phase calibration parameters, namely, the phase differences between channel signals $S_A$, $S_B$ of each range combination form a second-order matrix as shown in Table 1. The calculation formulas of the phase calibration parameters between the channel signals $S_A$, $S_B$ of each range combination are illustrated in formula (I) to formula (IV) respectively.

TABLE 1

Channel range combination matrix

| $S_A$ | $S_B$ | |
|---|---|---|
| | j1 | j2 |
| i1 | $PHS_AS_B(i1,j1)$ | $PHS_AS_B(i1,j2)$ |
| i2 | $PHS_AS_B(i2,j1)$ | $PHS_AS_B(i2,j2)$ |

$$PHS_AS_B(i1, j1) = PHS_B[j1] - PHS_A[i1] \quad \text{(I)}$$

$$PHS_AS_B(i1, j2) = PHS_B[j2] - PHS_A[i1] \quad \text{(II)}$$

$$PHS_AS_B(i2, j1) = PHS_B[j1] - PHS_A[i2] \quad \text{(III)}$$

$$PHS_AS_B(i2, j2) = PHS_B[j2] - PHS_A[i2] \quad \text{(IV)}$$

According to the above formula (I) to formula (IV), the following equation (V) can be derived:

$$PHS_AS_B(i1, j1) + PHS_AS_B(i2, j2) = PHS_AS_B(i1, j2) + PHS_AS_B(i2, j1) \quad \text{(V)}$$

Therefore, for any range combination in the form of a second-order matrix, providing that phase calibration parameters of three range combinations thereof are determined, the phase calibration parameter of the other range combination can be calculated through the above equation (V).

Furthermore, the inventor of the present application found that, when the effective value of a signal input reaches 10% of the range amplitude, its influence on phase measurement characteristics can be ignored. In particular, when the effective value of the signal input reaches 40% of the range amplitude, there is almost no influence on the phase measurement characteristics. Therefore, by selecting combinations of adjacent ranges, providing a smaller range reaches 10% of the full-scale amplitude of a larger range among the adjacent ranges, phase calibration parameters of three combinations in a second-order range combination matrix can be directly measured with the above characteristics, while the phase calibration parameter of the other range combination can be calculated through the above equation (V) taking advantage of the feature that the input channel signals are with zero phase difference. Phase calibration parameters of all range combinations can be derived through step-by-step calculation, and so forth. Thus the limitation of necessity to use a voltage divider or shunt when the range span is wide can be avoided.

FIG. 4 provides a flow chart of the zero-phase calibration method according to an embodiment of the present application. The method includes: step S1, selecting a group of range combinations with the range and a group of adjacent range combinations consisting of the range and a smaller range adjacent to the range between different channels A and B of a wide-range meter, measuring phase calibration parameters between channel signals of the group of range combinations with the same ranges and phase calibration parameters between channel signals of the group of adjacent range combinations; step S2, accomplishing measurements of phase calibration parameters of all of the group of range combinations with the same ranges and the group of adjacent range combinations, and storing the measured phase calibration parameters in a memory; step S3, invoking the measured phase calibration parameters stored in the memory to calculate phase calibration parameters between channel signals of each of the remaining range combinations of the wide-range meter level by level; step S4, storing the phase calibration parameters calculated in step S3 in the memory; and step S5, invoking corresponding phase calibration parameters stored in the memory to calibrate zero-phase points between different channels of signals of the meter while calibrating the wide-range meter.

According to preferable embodiments of the present application, the ratio between the smaller range and the larger range of adjacent range combinations of the wide-range meter reaches at least 0.1. As non-limiting examples, the ratio between the smaller range and the larger range of adjacent range combinations of the range meter can be 0.1, 0.2, 0.3, 0.4, 0.5, 0.6, 0.7, 0.8 or 0.9. Particularly preferably, the ratio between the smaller range and the larger range of adjacent range combinations of the wide-range meter is 0.4 or 0.5.

Continuing to refer to FIG. 4, in step S1, signals with the full-scale amplitude of the adjacent besides smaller range are output to channel A and channel B of the wide-range meter 2 by the standard source 3, and phase calibration parameters $PHS_AS_B(1,1)$, $PHS_AS_B(1,2)$, ..., $PHS_AS_B(i,i)$, $PHS_AS_B(i,i+1)$, ..., $PHS_AS_B(n,n)$ between channel signals $S_A$, $S_B$ of the group of range combinations with the same ranges as well as between channel signals $S_A$, $S_B$ of the group of adjacent range combinations are measured, wherein n is the number of measurement ranges of the wide-range meter 2, i is an integer and $1 \leq i \leq n-1$; in step S2, measurements of phase calibration parameters of all of the group of range combinations with the same ranges and the group of adjacent range combinations are accomplished and the measured phase calibration parameters are stored in the memory; in step S3, the measured phase calibration parameters stored in the memory are invoked, according to the equation $PHS_AS_B(i1,j1)+PHS_AS_B(i2,j2)=PHS_AS_B(i1,j2)+PHS_AS_B(i2,j1)$, $PHS_AS_B(i+1,i)$ is calculated by use of the formula $PHS_AS_B(i+1,i)=PHS_AS_B(i,i)+PHS_AS_B(i+1,i+1)-PHS_AS_B(i,i+1)$, and $PHS_AS_B(j+2,j)$ is calculated by use of the formula $PHS_AS_B(j+2,j)=PHS_AS_B(j+1,j)+PHS_AS_B(j+2,j+1)-PHS_AS_B(j+1,j+1)$, $PHS_AS_B(j,j+2)$ is calculated by use of the formula $PHS_AS_B(j,j+2)=PHS_AS_B(j,j+1)+PHS_AS_B(j+1,j+2)-PHS_AS_B(j+1,j+1)$, wherein j is an integer and $1 \leq j \leq n-2$, and so forth, phase calibration parameters between the channel signals $S_A$, $S_B$ of each of the remaining range combinations of the wide-range meter are calculated level by level.

Figure 5:
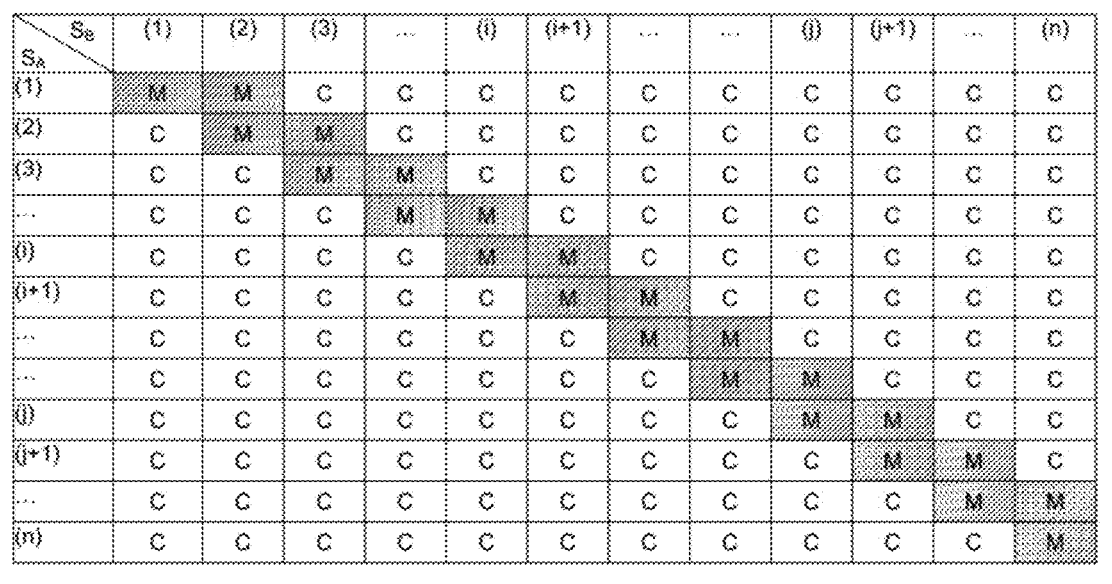

Referring to FIG. 5, which is a matrix diagram of phase calibration parameters between channel signals of each range combination when calibrating with the zero-phase calibration method provided by an embodiment of the present application. Wherein, n is the number of measurement ranges of the wide-range meter 2, n is an integer and $n \geq 3$, i and j represent the i-th measurement range and the j-th measurement range of channel $CH_A$ or channel $CH_B$ of the wide-range meter 2 respectively, both i and j are integers and $1 \leq i \leq j \leq n-1$. The range combinations in the matrix diagram consist of a certain measurement range of the channel $CH_A$ and a certain measurement range of the channel $CH_B$. In each range combination of the channels $CH_A$ and $CH_B$, the phase calibration parameters between the channel signals $S_A$, $S_B$ of the range combination indicated by the letter M in the matrix diagram are the parameters directly measured by use of the standard source in the above step S1. The phase calibration parameters between the channel signals $S_A$, $S_B$ of the range combination indicated by the letter C in the matrix diagram are the parameters calculated level by level according to the equation $PHS_AS_B(i1,j1)+PHS_AS_B(i2,j2)=PHS_AS_B(i1,j2)+PHS_AS_B(i2,j1)$ in the above step S3.

Referring to FIG. 3 to FIG. 5 simultaneously, in the calibration environment of the zero-phase calibration method as shown in FIG. 3, when the zero-phase point between different channels $CH_A$ and $CH_B$ of the wide-range meter 2 is to be calibrated by use of the zero-phase calibration method as in the present application through a computer device 1, a group of range combinations with the same ranges as well as a group of adjacent range combinations consisting of the range and a smaller range adjacent to the range are selected between two different channels $CH_A$, $CH_B$ of the wide-range meter 2 at first. With the computer device 1 controlling the standard source 3, signals with the full-scale amplitude of the adjacent besides smaller range are output, and two channels of signals are synchronously input into channels $CH_A$ and $CH_B$ of the wide-range meter 2, thereby the phase calibration parameters between channel signals $S_A$, $S_B$ of the group of range combinations with the same ranges and between channel signals $S_A$, $S_B$ of the group of adjacent range combinations are measured, which are indicated by the letter M in the matrix diagram of FIG. 5. The measured phase calibration parameters are transmitted to the memory of the computer device 1 for storage through the interface of the wide-range meter 2. Then, measurements of phase calibration parameters of all of the group of range combinations with the same ranges and the group of adjacent range combinations are accomplished, and the measured phase calibration parameters are stored in the memory, the processor of the computer device 1 invokes the measured phase calibration parameters stored in the memory to calculate the phase calibration parameters (which are indicated by the letter C in the matrix diagram of FIG. 5) between the channel signals $S_A$, $S_B$ of each of the remaining range combinations of the wide-range meter level by level according to the above equation (V), and they are stored in the memory of the computer device 1. Finally, the corresponding phase calibration parameters stored in the memory are invoked by the computer device 1 to automatically calibrate the zero-phase point between channels $CH_A$ and $CH_B$ of the wide-range meter 2. It should be noted, the computer device 1 is able to communicate with the standard source 3 through a USB interface so as to control the output signal of the standard source 3. The communication mode between the standard source 3 and the computer device 1 includes GPIB mode and RS232 mode, without limitation.

The wide-range meter 2 in the specification has a plurality of channels, each channel has more than two measurement ranges, and the range amplitudes of corresponding measurement ranges of each channel are equal. The measurement signals of channels of such wide-range, multi-channel meters can be AC voltage signals or AC current signals. Non-limiting examples of the wide-range meter comprise a multi-channel vector voltage analyzer with a voltage range in the range of 2 mV-5V; a multi-channel phase meter with a voltage range in the range of 10 mV-630V; a three-phase standard energy meter with a voltage range in the range of 60V-720V; a power analyzer with a voltage range in the range of 50 mV-1000V and a current range in the range of 5 mA-30A.

According to preferable embodiments of the present application, the wide-range meter 2 is a multi-channel vector voltage analyzer with the number of measurement ranges n of 11, wherein the measurement ranges of two measurement channels of voltage are set to [5V, 2V, 1V, 500 mV, 200 mV, 100 mV, 50 mV, 20 mV, 10 mV, 5 mV, 2 mV]. In the following, a phase calibration experiment was performed on the vector voltage analyzer according to the method described in the present application to verify the effectiveness of the method of the application.

Experimental Data

The experiment was directed to a typical calibration environment of a vector voltage analyzer with the model TH2000 being developed by the applicant of this application, three types of signal frequency of the standard source 3 were selected as the frequency of input voltage signals of the vector voltage analyzer, namely power frequency of 53 Hz, intermediate frequency of 1 kHz and high frequency of 10 kHz. The experiment selected calibration parameters measured and calculated at the intermediate frequency of 1 kHz as a criterion. Firstly, phase calibration parameters between channel signals of the group of range combinations with the same ranges and phase calibration parameters between channel signals of the group of adjacent range combinations were measured. After measurements of phase calibration parameters of all of the group of range combinations with the same ranges and the group of adjacent range combinations were accomplished and the measured phase calibration parameters were stored in a memory, the measured phase calibration parameters stored in the memory were invoked to calculate each of the remaining range combinations of the wide-range meter level by level and they were stored in the memory. Then, the corresponding phase calibration parameters stored in the memory were invoked to automatically calibrate the zero-phase point between the channels of the vector voltage analyzer.

Table 2 below is a table of phase calibration parameters measured and calculated at the intermediate frequency of 1 kHz (unit: nanosecond [ns], RG1 represents the selected range of channel $CH_A$ of signal $S_A$, RG2 represents the selected range of channel $CH_B$ of signal $S_B$).

TABLE 2

Table of phase calibration parameters

| | RG2 | | | | | | | | | | |
|---|---|---|---|---|---|---|---|---|---|---|---|
| RG1 | 5 V | 2 V | 1 V | 500 mV | 200 mV | 100 mV | 50 mV | 20 mV | 10 mV | 5 mV | 2 mV |
| 5 V | 1.9 | 45.3 | 27.6 | 2.0 | 14.2 | −3.6 | −29.3 | −152.5 | −178.3 | −702.2 | −728.0 |
| 2 V | −41.5 | 2.0 | −15.8 | −41.4 | −29.2 | −46.9 | −72.6 | −195.9 | −221.9 | −745.6 | −771.4 |
| 1 V | −24.0 | 19.4 | 1.7 | −23.9 | −11.7 | −29.5 | −55.2 | −178.4 | −204.4 | −728.1 | −753.9 |
| 500 mV | 1.3 | 44.8 | 27.0 | 1.4 | 13.6 | −4.1 | −29.8 | −153.1 | −179.1 | −702.8 | −728.6 |
| 200 mV | −10.2 | 33.3 | 15.6 | −10.1 | 2.1 | −15.6 | −41.3 | −164.6 | −190.5 | −714.3 | −740.1 |
| 100 mV | 7.3 | 50.8 | 33.1 | 7.4 | 19.6 | 1.9 | −23.8 | −147.1 | −173.0 | −696.8 | −722.6 |
| 50 mV | 32.6 | 76.1 | 58.4 | 32.7 | 44.9 | 27.2 | 1.5 | −121.8 | −147.7 | −671.5 | −697.3 |
| 20 mV | 156.6 | 200.0 | 182.3 | 156.7 | 168.9 | 151.1 | 125.4 | 2.2 | −23.8 | −547.5 | −573.3 |
| 10 mV | 182.1 | 225.6 | 207.9 | 182.2 | 194.4 | 176.7 | 151.0 | 27.7 | 1.8 | −522.0 | −547.8 |
| 5 mV | 707.9 | 751.4 | 733.7 | 708.0 | 720.2 | 702.5 | 676.8 | 553.5 | 527.6 | 3.8 | −22.0 |
| 2 mV | 732.9 | 776.3 | 758.6 | 732.9 | 745.1 | 727.4 | 701.7 | 578.5 | 552.5 | 28.7 | 2.9 |

It should be noted, the underlined values in the above Table 2 pertain to directly measured phase calibration parameters (wherein the ratio between the smaller range and the larger range of adjacent range combinations is 0.4 or 0.5), and other values pertain to the phase calibration parameters calculated by the method according to the present application.

The experiment ran measurements as well on the actual phase differences before calibration for the range combinations with the ratio between the smaller range and the larger range reached 0.1 whilst the range combinations included the ranges of 100 mV and above. The actual phase differences were compared to the corresponding data listed in the above Table 2 and then converted into angle values to evaluate the influence of measurement error. The results show that at the power frequency of 53 Hz, the phase error is within 2 μrad; at the intermediate frequency of 1 kHz, the phase error is within 1 μrad; at the high frequency of 10 kHz, the phase error is within 10 μrad. It is well known to those skilled in the art that the above values of error are within a negligible range at the corresponding frequency. Thus, it can be verified that as discussed above in this application, when the effective value of an input signal reaches 10% of the range amplitude, the influence on the phase measurement characteristics can be ignored.

In the following, data that meet the requirement of phase difference measured after the vector voltage analyzer being overwritten by the phase calibration parameters are selected to evaluate the effectiveness of the zero-phase calibration method of the present application.

Particularly, Table 3 below shows phase differences measured after the vector voltage analyzer being overwritten by the phase calibration parameters listed in Table 2 while the input signals are at the power frequency of 53 Hz (unit: prad, RG1 represents the selected range of channel $CH_A$ of signal $S_A$, RG2 represents the selected range of channel $CH_B$ of signal $S_B$). It should be noted, the range combinations without slash in Table 3 meet the requirement that the ratio between the smaller range and the larger range reaches 0.1, the values of measured phase differences listed in such range combination boxes are substantially accurate and can be used to evaluate the state of phase calibration. The range combinations marked with slash in Table 3 do not meet the requirement that the ratio between the smaller range and the larger range reaches 0.1, and the values of measured phase differences may include considerable errors, they are listed in the table for reference.

It can be seen from the data in Table 3, the absolute values of phase differences measured at the power frequency of 53 Hz after the vector voltage analyzer being overwritten by the phase calibration parameters listed in Table 2 obtained according to the method of the present application are all considerably small. Among the range combinations without slash, the absolute values of phase differences of the range combinations that only include the range of 100 mV and above are all within 2 μrad, and the absolute values of phase differences of the range combinations that only include the range of 100 mV and below are all within 10 μrad. It is well known to those skilled in the art that such values of phase differences are within a substantially negligible range at the corresponding frequency and measurement range. Therefore, it can be determined that the vector voltage analyzer after calibration has returned to zero with regard to phase difference.

Table 4 below shows phase differences measured after the vector voltage analyzer being overwritten by the phase calibration parameters listed in Table 2 while the input signals are at an intermediate frequency of 1 kHz (unit: μrad, RG1 represents the selected range of channel $CH_A$ of signal $S_A$, RG2 represents the selected range of channel $CH_B$ of signal $S_B$). Similarly, the range combinations without slash in Table 4 meet the requirement that the ratio between the smaller range and the larger range reaches 0.1, and can be used to evaluate the state of phase calibration. It can be seen from the data in Table 4 that, the absolute values of phase differences measured at the intermediate frequency of 1 kHz after the vector voltage analyzer being overwritten by the phase calibration parameters listed in Table 2 obtained according to the method of the present application are all considerably small. Among the range combinations without slash, the absolute values of phase differences of the range combinations that only include the range of 100 mV and above are all within 1prad, and the absolute values of phase differences of the range combinations that only include the range of 100 mV and below are all within 10 μrad. It is well known to those skilled in the art that such values of phase differences are within a substantially negligible range at the corresponding frequency and measurement range. Therefore, it can be determined that the vector voltage analyzer after calibration has returned to zero with regard to phase difference.

TABLE 3

Phase differences measured at the power frequency of 53 Hz after being overwritten by phase calibration parameters

| RG1 \ RG2 | 5 V | 2 V | 1 V | 500 mV | 200 mV | 100 mV | 50 mV | 20 mV | 10 mV | 5 mV | 2 mV |
|---|---|---|---|---|---|---|---|---|---|---|---|
| 5 V | 0.0 | 1.0 | −0.5 | −0.3 | ~~0.2~~ | ~~1.5~~ | ~~0.5~~ | ~~−2.8~~ | ~~−3.8~~ | ~~−3.8~~ | ~~−9.0~~ |
| 2 V | 0.0 | 0.0 | −0.6 | 0.2 | −1.2 | ~~0.9~~ | ~~2.2~~ | ~~−5.5~~ | ~~−4.2~~ | ~~−3.9~~ | ~~−7.1~~ |
| 1 V | −0.6 | −0.1 | −0.1 | 0.0 | 0.1 | 1.2 | ~~0.9~~ | ~~−2.5~~ | ~~−0.4~~ | ~~13.8~~ | ~~−5.0~~ |
| 500 mV | 0.1 | 1.2 | −0.2 | −0.1 | 0.2 | 0.8 | 0.8 | ~~−4.0~~ | ~~−0.7~~ | ~~−0.6~~ | ~~1.5~~ |
| 200 mV | ~~0.8~~ | 0.6 | 0.3 | −0.4 | 0.1 | 0.8 | 0.3 | −4.5 | ~~−5.5~~ | ~~3.2~~ | ~~19.5~~ |
| 100 mV | ~~0.6~~ | ~~1.3~~ | 0.0 | −0.9 | −0.8 | 0.0 | −0.2 | −4.3 | 7.0 | ~~−3.2~~ | ~~4.3~~ |
| 50 mV | ~~0.1~~ | ~~0.9~~ | ~~0.4~~ | −0.1 | −0.5 | −0.3 | 0.2 | 0.0 | −0.3 | 7.4 | ~~1.9~~ |
| 20 mV | ~~2.0~~ | ~~2.1~~ | ~~2.1~~ | ~~3.0~~ | −2.1 | 0.7 | 0.6 | 0.0 | −2.3 | 0.3 | 4.9 |
| 10 mV | ~~3.5~~ | ~~3.1~~ | ~~2.5~~ | ~~0.3~~ | ~~1.2~~ | 1.3 | 1.9 | 1.4 | 2.0 | 8.2 | 5.1 |
| 5 mV | ~~1.3~~ | ~~13.0~~ | ~~−9.6~~ | ~~15.3~~ | ~~5.4~~ | ~~−3.4~~ | −4.8 | 2.4 | −1.4 | −0.9 | 0.2 |
| 2 mV | ~~−5.1~~ | ~~−6.1~~ | ~~−6.0~~ | ~~−5.2~~ | ~~−2.8~~ | ~~−3.4~~ | ~~−7.8~~ | −7.3 | −2.9 | −0.4 | 0.1 |

TABLE 4

Phase differences measured at the intermediate frequency of 1 kHz after being overwritten by phase calibration parameters

| RG1 \ RG2 | 5 V | 2 V | 1 V | 500 mV | 200 mV | 100 mV | 50 mV | 20 mV | 10 mV | 5 mV | 2 mV |
|---|---|---|---|---|---|---|---|---|---|---|---|
| 5 V | 0.0 | 0.1 | 0.3 | 0.5 | ~~1.0~~ | ~~1.3~~ | ~~−0.3~~ | ~~−3.1~~ | ~~−0.5~~ | ~~13.8~~ | ~~0.7~~ |
| 2 V | 0.0 | 0.0 | 0.0 | −0.3 | 0.2 | ~~0.2~~ | ~~1.0~~ | ~~−2.6~~ | ~~−5.9~~ | ~~4.8~~ | ~~−13.2~~ |

TABLE 4-continued

Phase differences measured at the intermediate frequency of 1 kHz after being overwritten by phase calibration parameters

| RG1\RG2 | 5 V | 2 V | 1 V | 500 mV | 200 mV | 100 mV | 50 mV | 20 mV | 10 mv | 5 mV | 2 mV |
|---|---|---|---|---|---|---|---|---|---|---|---|
| 1 V | −0.2 | 0.0 | −0.1 | 0.1 | 0.0 | 0.0 | ~~0.6~~ | ~~3.9~~ | ~~8.8~~ | ~~6.8~~ | ~~21.4~~ |
| 500 mV | −0.5 | −0.2 | −0.1 | −0.1 | 0.2 | 0.1 | 0.1 | ~~2.0~~ | ~~4.4~~ | ~~8.0~~ | ~~6.2~~ |
| 200 mV | ~~0.7~~ | −0.4 | −0.4 | −0.3 | −0.2 | −0.2 | −0.6 | 1.0 | ~~2.3~~ | ~~8.3~~ | ~~9.1~~ |
| 100 mV | ~~1.4~~ | ~~1.5~~ | −0.6 | −0.3 | −0.3 | −0.2 | −0.4 | 0.8 | 2.8 | ~~5.5~~ | ~~5.0~~ |
| 50 mV | ~~0.5~~ | ~~1.4~~ | ~~1.9~~ | −1.1 | −0.7 | 0.3 | 0.0 | 1.4 | 2.6 | 7.3 | ~~3.9~~ |
| 20 mV | ~~0.9~~ | ~~3.1~~ | ~~3.4~~ | ~~3.2~~ | −2.0 | −1.2 | −1.8 | 0.4 | 2.3 | 5.1 | 5.3 |
| 10 mV | ~~9.5~~ | ~~8.5~~ | ~~6.9~~ | ~~5.3~~ | ~~4.5~~ | −2.4 | −2.5 | −1.0 | −0.2 | 5.5 | −4.5 |
| 5 mV | ~~1.4~~ | ~~12.7~~ | ~~13.8~~ | ~~15.0~~ | ~~6.8~~ | ~~7.0~~ | −6.9 | −5.9 | 5.9 | 0.5 | −1.6 |
| 2 mV | ~~1.4~~ | ~~0.2~~ | ~~14.5~~ | ~~16.9~~ | ~~4.7~~ | ~~3.4~~ | ~~9.6~~ | −1.5 | −1.1 | 0.7 | 1.3 |

Table 5 below shows phase differences measured after the vector voltage analyzer being overwritten by the phase calibration parameters listed in Table 2 while the input signals are at the high frequency of 10 kHz (unit: prad, RG1 represents the selected range of channel $CH_A$ of signal $S_A$, RG2 represents the selected range of channel $CH_B$ of signal $S_B$).

TABLE 5

Phase differences measured at the high frequency of 10 kHz after being overwritten by phase calibration parameters

| RG1\RG2 | 5 V | 2 V | 1 V | 500 mV | 200 mV | 100 mV | 50 mV | 20 mV | 10 mV | 5 mV | 2 mV |
|---|---|---|---|---|---|---|---|---|---|---|---|
| 5 V | −1.3 | −6.5 | 1.4 | 4.8 | ~~8.8~~ | ~~13.2~~ | ~~18.0~~ | ~~25.3~~ | ~~24.0~~ | ~~9.3~~ | ~~34.1~~ |
| 2 V | −1.3 | −6.1 | −0.7 | 1.5 | 3.9 | ~~7.8~~ | ~~8.8~~ | ~~9.0~~ | ~~2.0~~ | ~~29.1~~ | ~~7.1~~ |
| 1 V | −4.6 | −8.3 | −0.4 | 0.7 | 1.7 | 4.4 | ~~8.1~~ | ~~8.1~~ | ~~8.9~~ | ~~33.1~~ | ~~34.8~~ |
| 500 mV | −7.9 | −2.5 | −1.2 | −0.2 | 0.6 | 2.7 | 5.3 | ~~8.8~~ | ~~5.9~~ | ~~13.8~~ | ~~79.4~~ |
| 200 mV | ~~12.4~~ | −5.8 | −2.4 | −0.4 | 0.3 | 1.0 | 3.3 | 8.8 | ~~5.5~~ | ~~3.9~~ | ~~5.8~~ |
| 100 mV | ~~18.2~~ | ~~18.2~~ | −5.3 | −2.2 | −0.2 | 0.6 | 1.6 | 4.9 | 4.6 | ~~7.9~~ | ~~9.9~~ |
| 50 mV | ~~24.8~~ | ~~7.8~~ | ~~8.9~~ | −5.5 | −3.7 | 0.5 | 1.7 | 2.6 | 3.4 | −4.3 | ~~2.8~~ |
| 20 mV | ~~6.1~~ | ~~24.6~~ | ~~16.7~~ | ~~14.2~~ | −11.1 | −3.1 | 0.5 | 2.5 | 4.1 | 3.9 | 17.4 |
| 10 mV | ~~8.1~~ | ~~2.8~~ | ~~19.2~~ | ~~16.8~~ | ~~14.1~~ | −6.5 | −0.9 | 3.5 | 4.2 | 3.4 | 21.6 |
| 5 mV | ~~6.1~~ | ~~2.8~~ | ~~9.9~~ | ~~28.0~~ | ~~14.6~~ | ~~4.9~~ | 0.9 | 13.0 | 24.2 | 18.5 | 38.5 |
| 2 mV | ~~6.1~~ | ~~2.8~~ | ~~9.9~~ | ~~8.0~~ | ~~23.0~~ | ~~3.6~~ | ~~5.9~~ | 7.1 | 24.1 | 29.4 | 39.6 |

Similarly, the range combinations without slash in Table 5 meet the requirement that the ratio between the smaller range and the larger range reaches 0.1, and can be used to evaluate the state of phase calibration. It can be seen from the data in Table 5, the absolute values of phase differences measured at the high frequency of 10 kHz after the vector voltage analyzer being overwritten by the phase calibration parameters listed in Table 2 obtained according to the method of the present application are all considerably small. Among the range combinations without slash, the absolute values of phase differences of the range combinations that only include the range of 100 mV and above are all within 10 arad, and the absolute values of phase differences of the range combinations that only include the range of 100 mV and below are all within 50 μrad. It is well known to those skilled in the art that such values of phase difference are within a substantially negligible range at the corresponding frequency and measurement range. Therefore, it can be determined that the vector voltage analyzer after calibration has returned to zero with regard to phase difference.

Therefore, it can be known from the above experiment that the zero-phase calibration method of the present application can be utilized to effectively calibrate the zero-phase point between signals of different channels of wide-range meters at various frequencies.

It should be noted that the above embodiments are only used to illustrate the technical solutions of the present application without limitation. The above embodiments or the technical features in different embodiments can be further combined within the concept of the present application, the steps may be implemented in any order, and there are many other variations regarding different aspects of the application as described above, which are not provided in detail for the sake of brevity. Although the present application has been described in detail with reference to the foregoing embodiments, it will be understood by those of ordinary skills in the art that the technical solutions described in the foregoing embodiments can still be modified, alternatively, some of the technical features therein can be equivalently substituted. These modifications or substitutions do not make the essence of the corresponding technical solution depart from the scope of technical solutions of the embodiments of the present application. For those of ordinary skills in the art, various modifications and variations can be made without departing from the concept of the present application, and these are all within the protection scope of the present application.

It should be understood, although various steps in the flow chart of FIG. 4 are shown in sequence as indicated by arrows, these steps are not necessarily implemented in the order indicated by arrows. Unless explicitly stated in the context, there is no strict order restriction on the implementation of these steps, and these steps can be executed in other orders. Moreover, at least some of the steps in FIG. 4 may include a plurality of sub-steps or multiple stages. These sub-steps or stages are not necessarily implemented simultaneously, but may be implemented at different times. The implementation of these sub-steps or stages is not necessarily sequential, but may be implemented in turn or alternately with other steps or at least part of sub-steps or stages of other steps.

A computer device comprises a memory and one or more processors.

Computer-readable instructions are stored in the memory. When the computer-readable instructions are executed by the processors, one or more processors are made to implement the following steps:

step S1, selecting a group of range combinations with the same ranges and a group of adjacent range combinations consisting of the range and a smaller range adjacent to the range between different channels A and B of the wide-range meter, measuring phase calibration parameters between channel signals of the group of range combinations with the same ranges and phase calibration parameters between channel signals of the group of adjacent range combinations;

step S2, accomplishing measurements of phase calibration parameters of all of the group of range combinations with the same ranges and the group of adjacent range combinations, and storing the measured phase calibration parameters in a memory;

step S3, invoking the measured phase calibration parameters stored in the memory to calculate phase calibration parameters between channel signals of each of the remaining range combinations of the wide-range meter level by level;

step S4, storing the calculated phase calibration parameters in the memory; and step S5, invoking corresponding phase calibration parameters stored in the memory to calibrate the zero-phase points between different channels of signals of the meter while calibrating the wide-range meter.

In some embodiments, the ratio between the smaller range and the larger range of the adjacent range combinations of the wide-range meter reaches at least 0.1.

In some embodiments, in the step S1, signals with the full-scale amplitude of the adjacent besides smaller range are output to the channels A and B of the wide-range meter by a standard source, phase calibration parameters $PHS_AS_B$(1,1), $PHS_AS_B$(1,2), . . . , $PHS_AS_B$(i,i), $PHS_AS_B$(i,i+1), . . . , $PHS_AS_B$(n,n) between channel signals $S_A$, $S_B$ of the group of range combinations with the same ranges as well as between channel signals $S_A$, $S_B$ of the group of adjacent range combinations are measured, wherein n is the number of measurement ranges of the wide-range meter, i is an integer and $1 \leq i \leq n-1$.

In some embodiments, in the step S3, the measured phase calibration parameters stored in the memory are invoked, according to the equation $PHS_AS_B$(i1,J1)+$PHS_AS_B$(i2,j2)=$PHS_AS_B$(i1,j2)+$PHS_AS_B$(i2,j1), $PHS_AS_B$(i+1,i) is calculated by use of the formula $PHS_AS_B$(i+1,i)=$PHS_AS_B$(i,i)+$PHS_AS_B$(i+1,i+1)−$PHS_AS_B$(i,i+1), and $PHS_AS_B$(j+2,j) is calculated by use of the formula $PHS_AS_B$(j+2,j)=$PHS_AS_B$(j+1,j)+$PHS_AS_B$(j+2,j+1)−$PHS_AS_B$(j+1,j+1), $PHS_AS_B$(j,j+2) is calculated by use of the formula $PHS_AS_B$(j,j+2)=$PHS_AS_B$(j,j+1)+$PHS_AS_B$(j+1,j+2)−$PHS_AS_B$(j+1,j+1), wherein j is an integer and $1 \leq j \leq n-2$, and so forth, phase calibration parameters between the channel signals $S_A$, $S_B$ of each of the remaining range combinations of the wide-range meter are calculated level by level.

In some embodiments, the ratio between the smaller range and the larger range of the adjacent range combination of the wide-range meter is 0.4 or 0.5.

In some embodiments, the channel signals are AC voltage signals.

A non-volatile computer-readable storage medium stores computer-readable instructions. When the computer-readable instructions are executed by processors, one or more processors are made to implement the following steps:

step S1, selecting a group of range combinations with the same ranges and a group of adjacent range combinations consisting of the range and a smaller range adjacent to the range between different channels A and B of the wide-range meter, measuring phase calibration parameters between channel signals of the group of range combinations with the same ranges and phase calibration parameters between channel signals of the group of adjacent range combinations;

step S2, accomplishing measurements of phase calibration parameters of all of the group of range combinations with the same ranges and the group of adjacent range combinations, and storing the measured phase calibration parameters in a memory;

step S3, invoking the measured phase calibration parameters stored in the memory to calculate phase calibration parameters between channel signals of each of the remaining range combinations of the wide-range meter level by level;

step S4, storing the calculated phase calibration parameters in the memory; and step S5, invoking corresponding phase calibration parameters stored in the memory to calibrate the zero-phase points between different channels of signals of the meter while calibrating the wide-range meter.

In some embodiments, the ratio between the smaller range and the larger range of the adjacent range combinations of the wide-range meter reaches at least 0.1.

In some embodiments, in the step S1, signals with the full-scale amplitude of the adjacent besides smaller range are output to the channels A and B of the wide-range meter by a standard source, phase calibration parameters $PHS_AS_B$(1,1), $PHS_AS_B$(1,2), . . . , $PHS_AS_B$(i,i), $PHS_AS_B$(i,i+1), . . . , $PHS_AS_B$(n,n) between channel signals $S_A$, $S_B$ of the group of range combinations with the same ranges as well as between channel signals $S_A$, $S_B$ of the group of adjacent range combinations are measured, wherein n is the number of measurement ranges of the wide-range meter, i is an integer and $1 \leq i \leq n-1$.

In some embodiments, in the step S3, the measured phase calibration parameters stored in the memory are invoked, according to the equation $PHS_AS_B$(i1,J1)+$PHS_AS_B$(i2,j2)=$PHS_AS_B$(i1,j2)+$PHS_AS_B$(i2,j1), $PHS_AS_B$(i+1,i) is calculated by use of the formula $PHS_AS_B$(i+1,i)=$PHS_AS_B$(i,i)+$PHS_AS_B$(i+1,i+1)−$PHS_AS_B$(i,i+1), and $PHS_AS_B$(j+2,j) is calculated by use of the formula $PHS_AS_B$(j+2,j)=$PHS_AS_B$(j+1,j)+$PHS_AS_B$(j+2,j+1)−$PHS_AS_B$(j+1,j+1), $PHS_AS_B$(j,j+2) is calculated by use of the formula $PHS_AS_B$(j,j+2)=$PHS_AS_B$(j,j+1)+$PHS_AS_B$(j+1,j+2)−$PHS_AS_B$(j+1,j+1), wherein j is an integer and $1 \leq j \leq n-2$, and so forth, phase calibration parameters between the channel signals $S_A$, $S_B$ of each of the remaining range combinations of the wide-range meter are calculated level by level.

In some embodiments, the ratio between the smaller range and the larger range of the adjacent range combination of the wide-range meter is 0.4 or 0.5.

In some embodiments, the channel signals are AC voltage signals.

It can be understood by those of ordinary skills in the art that all or part of the processes in realizing the method of the above embodiments can be fulfilled by instructing relevant hardware through computer-readable instructions. The computer-readable instructions can be stored in a non-volatile computer-readable device. The computer-readable instructions may include the processes of the embodiments of the above method when executed. Wherein, any reference to a memory, storage, database or other medium used in various embodiments provided in the present application may include non-volatile and/or volatile memory. Non-volatile memory may include read-only memory (ROM), programmable ROM (PROM), electrically programmable ROM (EPROM), electrically erasable programmable ROM (EEPROM), or flash memory. Volatile memory may include random access memory (RAM) or external cache memory. By way of illustration rather than limitation, RAM is available in many forms, such as static RAM (SRAM), dynamic RAM (DRAM), synchronous DRAM (SDRAM), double data rate SDRAM (DDRSDRAM), enhanced SDRAM (ESDRAM), Synchlink DRAM (SLDRAM), Rambus direct RAM (RDRAM), direct memory bus dynamic RAM (DRDRAM), and memory bus dynamic RAM (RDRAM), etc.

The technical features of the above embodiments can be combined in any way. For sake of brevity of the description, not all of the possible combinations of the technical features in the above embodiments are described. However, as long as there is no contradiction in the combination of these technical features, all possible combinations should be considered to be within the scope of the specification.

The above embodiments only illustrate several embodiments of the present application, and their descriptions are relatively specific and in detail, but they should not be construed as limiting the scope of the invention. It should be noted, for those of ordinary skills in the art, various modifications and variations can be made without departing from the concept of the present application, and these all fall within the protection scope of the present application. Therefore, the protection scope of this patent application should be determined by the attached claims.

The invention claimed is:

1. A zero-phase calibration method for calibrating zero-phase points between different channels of signals of a wide-range meter, including:

step S1, selecting a group of range combinations with a range and a group of adjacent range combinations consisting of the range and a smaller range adjacent to the range between different channels A and B of the wide-range meter outputting signals with the full-scale amplitude of the smaller range to the channels A and B of the wide-range meter by a standard source, measuring phase calibration parameters $PHS_AS_B(1,1)$, $PHS_AS_B(1,2)$, ..., $PHS_AS_B(i,i)$, $PHS_AS_B(i,i+1)$, ..., $PHS_AS_B(n,n)$ between channel signals $S_A$, $S_B$ of the group of range combinations with the range as well as between channel signals $S_A$, $S_B$ of the group of adjacent range combinations, wherein n is the number of measurement ranges of the wide-range meter, i is an integer and $1 \leq i \leq n-1$;

step S2, accomplishing measurements of phase calibration parameters of all of the group of range combinations with the range and the group of adjacent range combinations, and storing the measured phase calibration parameters in a memory;

step S3, invoking the measured phase calibration parameters stored in the memory, according to the equation $PHS_AS_B(i1,j1)+PHS_AS_B(i2,j2)=PHS_AS_B(i1,j2)+PHS_AS_B(i2,j1)$, calculating $PHS_AS_B(i+1,i)$ by use of the formula $PHS_AS_B(i+1,i)=PHS_AS_B(i,i)+PHS_AS_B(i+1,i+1)-PHS_AS_B(i,i+1)$, and calculating $PHS_AS_B(j+2,j)$ by use of the formula $PHS_AS_B(j+2,j)=PHS_AS_B(j+1,j)+PHS_AS_B(j+2,j+1)-PHS_AS_B(j+1,j+1)$, calculating $PHS_AS_B(j,j+2)$ by use of the formula $PHS_AS_B(j,j+2)=PHS_AS_B(j,j+1)+PHS_AS_B(j+1,j+2)-PHS_AS_B(j+1,j+1)$, wherein j=1, ..., n–2, calculating phase calibration parameters between the channel signals $S_A$, $S_B$ of each of the remaining range combinations of the wide-range meter level by level;

step S4, storing the calculated phase calibration parameters in the memory; and step S5, invoking corresponding phase calibration parameters stored in the memory to calibrate the zero-phase points between different channels of signals of the meter while calibrating the wide-range meter.

2. The method according to claim 1, characterized in that the ratio between the smaller range and the larger range of the adjacent range combinations of the wide-range meter is greater than or equal to 0.1 and less than 1.

3. The method according to claim 2, characterized in that, the ratio between the smaller range and the larger range of the adjacent range combination of the wide-range meter is 0.4 or 0.5.

4. The method according to claim 3, characterized in that, the channel signals are AC voltage signals.

5. The method according to claim 3, characterized in that, the channel signals are AC current signals.

6. The method according to claim 4, characterized in that, the number n of measurement ranges of the wide-range meter is 11, wherein the measurement ranges for measuring the AC voltage signals are in the range of 2 mV-5V.

7. A computer device comprising a memory and one or more processors, wherein computer-readable instructions are stored in the memory, when the computer-readable instructions are executed by said one or more processors, said one or more processors are made to implement the following steps:

step S1, selecting a group of range combinations with a range and a group of adjacent range combinations consisting of the range and a smaller range adjacent to the range between different channels A and B of the wide-range meter, outputting signals with the full-scale amplitude of the smaller range to the channels A and B of the wide-range meter by a standard source, measuring phase calibration parameters $PHS_AS_B(1,1)$, $PHS_AS_B(1,2)$, ..., $PHS_AS_B(i,i)$, $PHS_AS_B(i,i+1)$, ..., $PHS_AS_B(n,n)$ between channel signals $S_A$, $S_B$ of the group of range combinations with the range as well as between channel signals $S_A$, $S_B$ of the group of adjacent range combinations, wherein n is the number of measurement ranges of the wide-range meter, i is an integer and $1 \leq i \leq n-1$;

step S2, accomplishing measurements of phase calibration parameters of all of the group of range combinations with the range and the group of adjacent range combinations, and storing the measured phase calibration parameters in a memory;

step S3, invoking the measured phase calibration parameters stored in the memory, according to the equation $PHS_AS_B(i1,j1)+PHS_AS_B(i2,j2)=PHS_AS_B(i1,j2)+PHS_AS_B(i2,j1)$, calculating $PHS_AS_B(i+1,i)$ by use of the formula $PHS_AS_B(i+1,i)=PHS_AS_B(i,i)+PHS_AS_B(i+1,i+1)-PHS_AS_B(i,i+1)$, and calculating $PHS_AS_B(j+2,j)$ by use of the formula $PHS_AS_B(j+2,j)=PHS_AS_B(j+1,j)+PHS_AS_B(j+2,j+1)-PHS_AS_B(j+1,j+1)$, calculating $PHS_AS_B(j,j+2)$ by use of the formula $PHS_AS_B(j,j+2)=PHS_AS_B(j,j+1)+PHS_AS_B(j+1,j+2)-PHS_AS_B(j+1,j+1)$, wherein j=1, ..., n−2, calculating phase calibration parameters between the channel signals $S_A$, $S_B$ of each of the remaining range combinations of the wide-range meter level by level;

step S4, storing the calculated phase calibration parameters in the memory; and step S5, invoking corresponding phase calibration parameters stored in the memory to calibrate the zero-phase points between different channels of signals of the meter while calibrating the wide-range meter.

8. The method according to claim 7, characterized in that, the ratio between the smaller range and the larger range of the adjacent range combinations of the wide-range meter is greater than or equal to 0.1 and less than 1.

9. The computer device according to claim 8, characterized in that, the ratio between the smaller range and the larger range of the adjacent range combination of the wide-range meter is 0.4 or 0.5.

10. The computer device according to claim 9, characterized in that, the channel signals are AC voltage signals.

11. One or more non-transitory computer-readable storage medium storing computer-readable instructions, wherein when the computer-readable instructions are executed by one or more processors, said one or more processors are made to implement the following steps:

step S1, selecting a group of range combinations with a range and a group of adjacent range combinations consisting of the range and a smaller range adjacent to the range between different channels A and B of the wide-range meter, outputting signals with the full-scale amplitude of the smaller range to the channels A and B of the wide-range meter by a standard source, measuring phase calibration parameters $PHS_AS_B(1,1)$, $PHS_AS_B(1,2)$, ..., $PHS_AS_B(i,i)$, $PHS_AS_B(i,i+1)$, ..., $PHS_AS_B(n,n)$ between channel signals $S_A$, $S_B$ of the group of range combinations with the range as well as between channel signals $S_A$, $S_B$ of the group of adjacent range combinations, wherein n is the number of measurement ranges of the wide-range meter, i is an integer and $1 \leq i \leq n-1$;

step S2, storing the phase calibration parameters in a memory;

step S3, invoking the measured phase calibration parameters stored in the memory, according to the equation $PHS_AS_B(i1,j1)+PHS_AS_B(i2,j2)=PHS_AS_B(i1,j2)+PHS_AS_B(i2,j1)$, calculating $PHS_AS_B(i+1,i)$ by use of the formula $PHS_AS_B(i+1,i)=PHS_AS_B(i,i)+PHS_AS_B(i+1,i+1)-PHS_AS_B(i,i+1)$, and calculating $PHS_AS_B(j+2,j)$ by use of the formula $PHS_AS_B(j+2,j)=PHS_AS_B(j+1,j)+PHS_AS_B(j+2,j+1)-PHS_AS_B(j+1,j+1)$, calculating $PHS_AS_B(j,j+2)$ by use of the formula $PHS_AS_B(j,j+2)=PHS_AS_B(j,j+1)+PHS_AS_B(j+1,j+2)-PHS_AS_B(j+1,j+1)$, wherein j=1, ..., n−2, calculating phase calibration parameters between the channel signals $S_A$, $S_B$ of each of the remaining range combinations of the wide-range meter level by level;

step S4, storing the calculated phase calibration parameters in the memory; and step S5, invoking corresponding phase calibration parameters stored in the memory to calibrate the zero-phase points between different channels of signals of the meter while calibrating the wide-range meter.

12. The method according to claim 11, characterized in that, the ratio between the smaller range and the larger range of the adjacent range combinations of the wide-range meter is greater than or equal to 0.1 and less than 1.

13. The storage medium according to claim 12, characterized in that, the ratio between the smaller range and the larger range of the adjacent range combination of the wide-range meter is 0.4 or 0.5.

14. The storage medium according to claim 13, characterized in that, the channel signals are AC voltage signals.

* * * * *

UNITED STATES PATENT AND TRADEMARK OFFICE
CERTIFICATE OF CORRECTION

PATENT NO. : 12,259,492 B2
APPLICATION NO. : 18/721717
DATED : March 25, 2025
INVENTOR(S) : Xinhua Zhou Page 1 of 1

It is certified that error appears in the above-identified patent and that said Letters Patent is hereby corrected as shown below:

In the Claims

Column 15, Line 55, a "," is to be placed between "wide-range meter" and "outputting".

Signed and Sealed this
Twenty-ninth Day of April, 2025

Coke Morgan Stewart
*Acting Director of the United States Patent and Trademark Office*